United States Patent [19]

Takemae et al.

[11] 4,158,241
[45] Jun. 12, 1979

[54] SEMICONDUCTOR MEMORY DEVICE WITH A PLURALITY OF MEMORY CELLS AND A SENSE AMPLIFIER CIRCUIT THEREOF

[75] Inventors: Yoshihiro Takemae, Kawasaki; Tomio Nakano, Yokohama, both of Japan

[73] Assignee: Fujitsu Limited, Japan

[21] Appl. No.: 915,864

[22] Filed: Jun. 15, 1978

[51] Int. Cl.² .............................................. G11C 7/06
[52] U.S. Cl. .................................. 365/205; 307/279; 307/DIG. 3
[58] Field of Search ................... 365/205, 149, 154; 307/DIG. 3, 279, 205

[56] References Cited

U.S. PATENT DOCUMENTS 4,050,061  9/1977  Kitagawa ........................ 365/205
4,051,388  9/1977  Inukai ............................. 365/205

Primary Examiner—Stuart N. Hecker
Attorney, Agent, or Firm—Staas & Halsey

[57] ABSTRACT

A driving circuit is provided for driving a sense amplifier, especially in a semiconductor memory device of one transistor cell type. The driving circuit is comprised of MIS transistors of which gates are connected in common via at least one resistor and which have different current amplification factors. A driving signal is directly applied to the MIS transistor having lower current amplification factor in the MIS transistors and it is then applied to the MIS transistor having higher current amplification factor in the MIS transistors through the resistor with time delay for establishing a gradually increasing current from the sense amplifier to the ground to ensure the correct sensing of information stored in the memory cell.

7 Claims, 13 Drawing Figures

SEMICONDUCTOR MEMORY DEVICE WITH A PLURALITY OF MEMORY CELLS AND A SENSE AMPLIFIER CIRCUIT THEREOF

BACKGROUND OF THE INVENTION

1. Field of the Invention

This invention relates to a semiconductor memory device with a plurality of one transistor memory cells and a sense amplifier circuit comprised of a flip-flop circuit having a plurality of MIS transistors, and moreover relates to an improvement in the driving circuit for the sense amplifier circuit of this type.

2. Description of the Prior Art

A memory device of which memory cells are respectively composed of one MOS FET and one memory capacitor is generally capable of discriminating "1" or "0" values of the stored data in accordance with the fact that an output voltage of this capacitor is higher or lower than the specified threshold level. However, because of small difference of output voltage of the cell and the threshold voltage, the output voltage is generally amplified by the sense amplifier which forms a flip-flop circuit. In such a sense amplifier circuit, the difference between the output voltage of the cell in the memory device and the threshold voltage is small and therefore such amplifier circuit causes a following disadvantage that when the stored data is, for example, "1", the cell output which should originally be higher than the threshold voltage becomes lower than it due to deviation of the resistance of wirings in the flip-flop circuit, thereby causing an error data. Thus, as a means for solving this disadvantage, the technique of gradually increasing a current which flows through the flip-flop circuit is proposed by Clinton Kuo et al. of Texas Instruments, Dallas, Tex. in Electronics, May 13, 1976. Particularly, description of the second column in the left side on page 83 is closely related to such content and the left upper figure on page 84 may be referred as the reference. According to this technique, a multiple grounding path having three transistors is provided for the flip-flop circuit, whereby these three transistors are made conductive by means of different three clocks and resultingly a current flowing through the flip-flop circuit is gradually increased. However, such technique requires three different clocks and therefore requires a means for generating such clocks, making the circuit configuration complicated.

SUMMARY OF THE INVENTION

It is an object of this invention to provide a simple sense amplifier circuit which does not malfunction resulting from deviation of line resistance in the circuit.

It is another object of this invention to provide a sense amplifier circuit comprised of a flip-flop circuit having such a configuration that gates of the adjacent MIS transistors are connected by a resistor means and an input signal is directly applied to one gate.

It is a further object of this invention to provide a semiconductor memory device which has a plurality of flip-flop circuits amplifying a voltage difference between a pair of conductors connected to each of the circuits and a driving circuit connected to said plurality of flip-flop circuits in common for controlling a current flowing through said flip-flop circuit.

According to the present invention, the abovementioned sense amplifier circuit is so constructed that a common source of MIS transistors is connected to the ground via a plurality of MIS transistors of which gates are connected though a resistor means, and a drive signal for the flip-flop circuit is directly applied to one of the gates of these MIS transistors. Accordingly, only a minute current flows through the sense amplifier, just after a drive signal of the sense amplifier circuit is applied and therefore even when deviation of the line resistance of the sense amplifier circuit exists, a voltage drop as large as such deviation due to a line resistance can be kept lower than a voltage difference in accordance with the data read out from the memory cell. Therefore, after a voltage difference based on the abovementioned read out data is pre-amplified by this minute current up to such a level as high as being free from an influence of deviation of line resistance, namely after a delay time determined by the resistance means connected across the gates of the MIS transistors and a parasitic capacitance of the gates from the application of said drive signal, required amplification is performed and sufficient current flows through the sense amplifier circuit. Whereby, amplification of error data signal resulting from a voltage drop due to deviation of line resistance can be effectively prevented.

Other features and objects of the present invention will be made clear from the following description regarding the preferred embodiment.

DESCRIPTION OF THE PREFERRED EMBODIMENT

Figure 1:
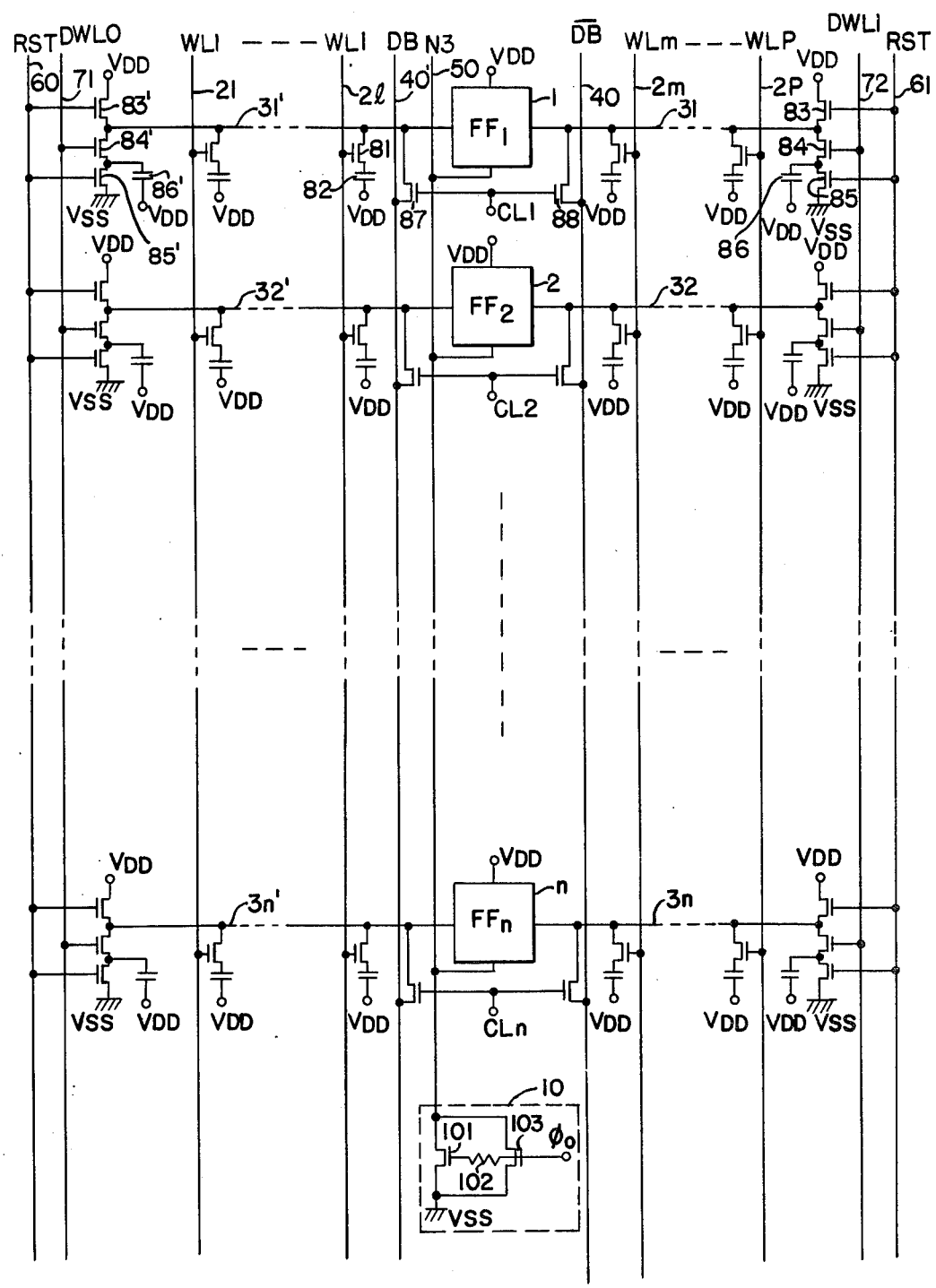
FIG. 1 shows a schematic diagram of a semiconductor memory device provided with a sense amplifier circuit in accordance with the present invention.

FIG. 1 is an overall schematic circuit diagram of a semiconductor memory device provided with a sense amplifier circuit of this invention. The semiconductor memory device shown in FIG. 1 has the flip-flop circuits 1 to n and a common flip-flop driving circuit 10 for such flip-flop circuits, and each one of the flip-flop circuits among the abovementioned n circuits and the flip-flop driving circuit constitutes one sense amplifier.

From each flip-flop circuit, bit lines 31 to 3n are respectively extended in the horizontal direction, and in the both sides of each flip-flop circuit, word lines 21 to 21 and 2m to 2p are extended in orthogonal relation to these bit lines. To each intersection of the bit lines and the word lines, there is provided a memory cell consisting of a MIS (Metal Insulator Semiconductor) transistor 81 and a capacitor 82 which is charged in correspondence with data.

Moreover, the bit lines crosses orthogonally with the data bus lines 40 and 40' in addition to the aforementioned word lines, and at the intersection of the bit lines and each of the data bus lines 40 and 41, MIS transistors 87 and 88 are connected respectively.

Furthermore, the common line 50 is extended as the line orthogonally crossing with the bit lines, and each of flip-flop circuits 1 to n are connected thereto. The termination end of this common line 50 is connected to the flip-flop driving circuit which is the most essential portion of this invention.

This flip-flop driving circuit is comprised of the MIS transistors 101 and 103, and the gates of these transistors are connected to each other via a resistor 102. Also, the current amplification factor $\beta$ of the MIS transistor 103 is selected to be smaller than that of the MIS transistor 101.

On the other hand, in both sides of the abovementioned word lines, reset lines 60 and 61, and dummy word lines 71 and 72 are extended in parallel to them. The reset lines 60 and 61 are respectively connected with MIS transistors 83' and 85', 83 and 85, while the dummy word lines 71 and 72 are respectively connected with MIS transistors 84' and 84.

To the connecting point of the MIS transistors 83 and 84, the abovementioned bit line 31 is connected while, to the connecting point of the transistors 83' and 84', the bit line 31' is connected. In addition, to the connecting point of the MIS transistor 84 and 85, the capacitor 86 is connected. A dummy cell is configured by this MIS transistor 84 and capacitor 86. On the other hand, another dummy cell is configured by the MIS transistor 84' and capacitor 86'.

Figure 2A:
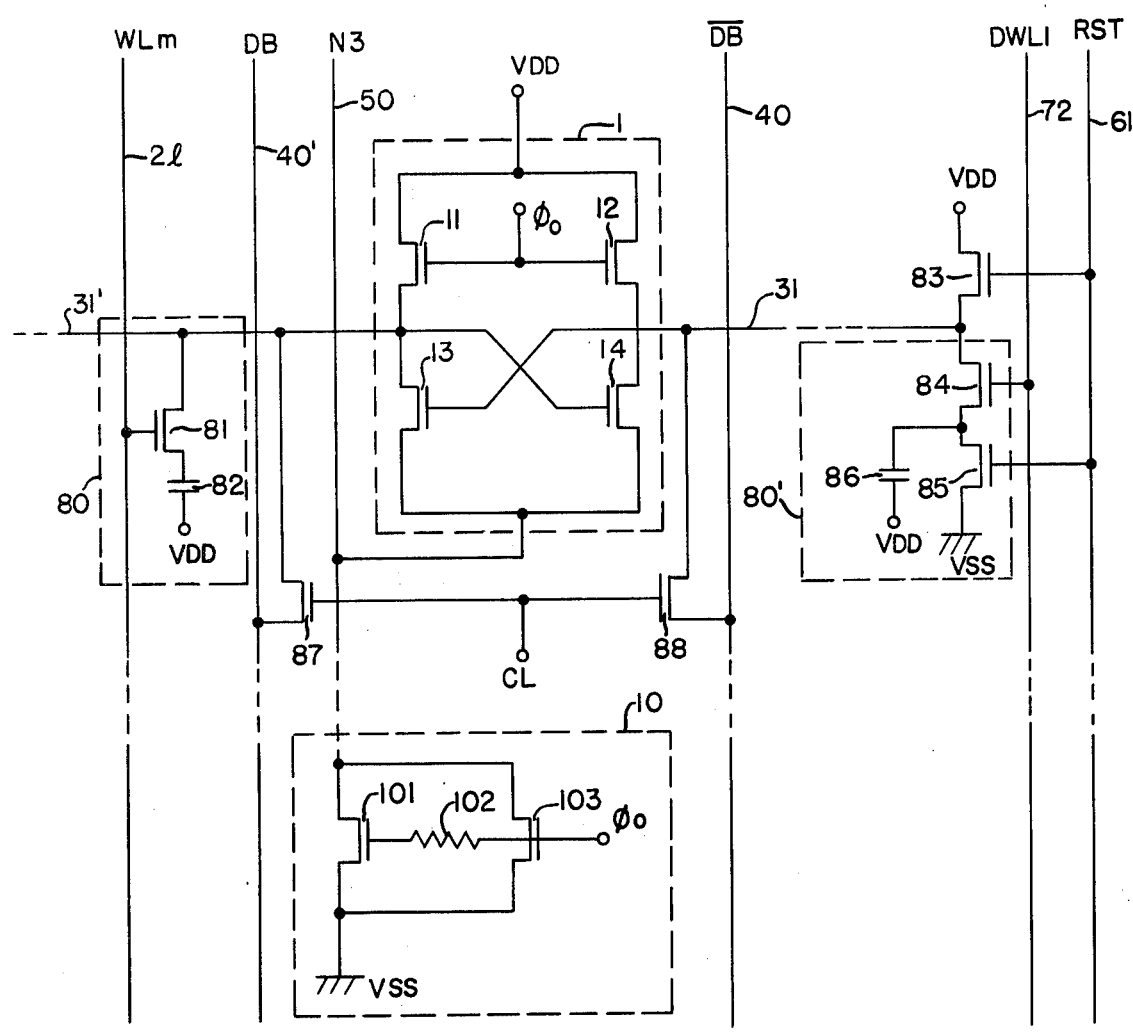
FIG. 2A shows a sense amplifier circuit and corresponding memory cell and the circuit associated with them, which are essential parts of the present invention.

FIG. 2A shows, in order to explain the operation of such semiconductor memory device, the flip-flop circuit 1, flip-flop driving circuit 10, and the circuit incorporated to bit line 31 in such a case that the memory cell 80 consisting of the MIS transistor 81 and the capacitor 82 is selected.

In FIG. 2A, the flip-flop circuit 1 is shown in more detail. Namely, the flip-flop circuit 1 has the MIS transistors 11, 12, 13 and 14. The gates of the MIS transistors 11 and 12 are connected in common and to these gates the signal $\phi_o$ is applied to which signal is also used as the drive signal $\phi_o$ to the flip-flop driving circuit 10 described later. Here, the MIS transistors 11 and 12, 13 and 14 have respectively equal current amplification factors. The gate of MIS transistor 13 is connected to the bit line 31, while the gate of MIS transistor 14 is connected to the bit line 31'. On the other hand, the sources of these MIS transistors are connected to a common line 50. Hereinafter, FIG. 2A will be explained by referring to the FIG. 3A, B, C, D, E and F which show each signal of the circuit shown in FIG. 2A and voltage waveforms of each point of the same.

In the beginning of the read out operation of the memory device, a high level voltage, namely 12 volt is applied to both reset line 61 and the reset line 60 shown in FIG. 1, and both MIS transistors 83 and 83' which are symmetrically arranged to the flip-flop circuit 1 in FIG. 1 are conductive, and therefore charges are accumulated in the stray capacitor of the bit lines 31 and 31'.

This presumes that the data "1" has been written in the memory cell which is now to be read out and charges are stored in the capacitor 82. On the other hand, MIS transistor 85 is conductive since the reset line 61 is high level, and no charge is stored in the capacitor 86 of the dummy cell 80'.

Figure 3A:
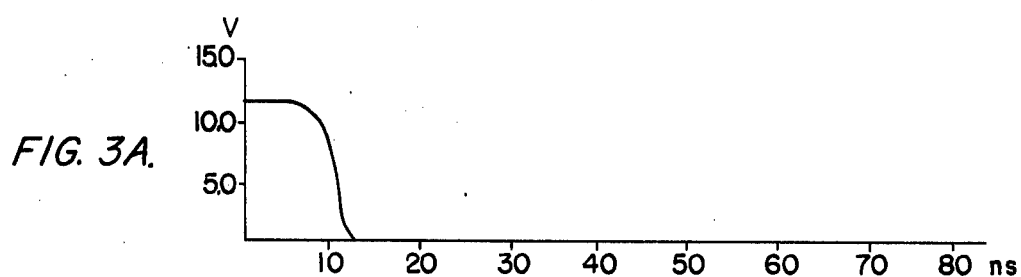
FIG. 3A shows variation of voltage on a reset line of the memory device shown in FIG. 1.
Figure 3B:
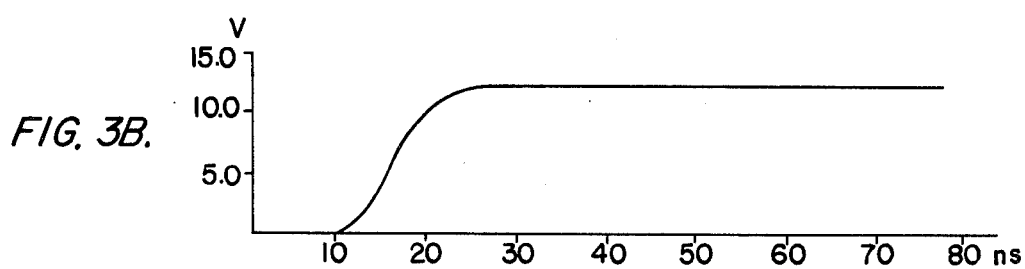
FIG. 3B shows variation of voltage on a word line and a dummy word line of the memory device shown in FIG. 1.

When the operation of reading out the data commences from this condition, a potential on the reset line decreases from a high level (12V) to a low level (0V) as shown in FIG. 3A, making the MIS transistors 83, 85 nonconductive and resultingly the bit line 31 enters into the floating condition. Simultaneously, the potential of the word line 21 to which the memory cell 80 is connected and that of the dummy word line 72 increase to a high level (12V) from a low level (0V) as shown in FIG. 3B. Thus, both the MIS transistor 81 in the memory cell 80' and the MIS transistor 84 in the dummy cell become conductive.

At this time, the capacitor 82 in the memory cell 80 is charged and the charge stored in the stray capacitor of the bit line 31' remains as it is since charges are not accumulated in the capacitor 82 from the bit line 31' via the MIS transistor 81. Thus, the potential of the bit line 31' does not change but the capacitor 86 in the dummy cell 80' is in the discharged condition. Therefore, charges stored in the stray capacitor of the bit line 31 are charged into the capacitor 86 from the bit line 31 because the reset line 61 is in a low level and the MIS transistor is already in the nonconductive condition. Therefore, a potential of the bit line 31 is lowered by only $\Delta V$ from the potential of the bit line 31' as shown in FIG. 3E.

Figure 3C:
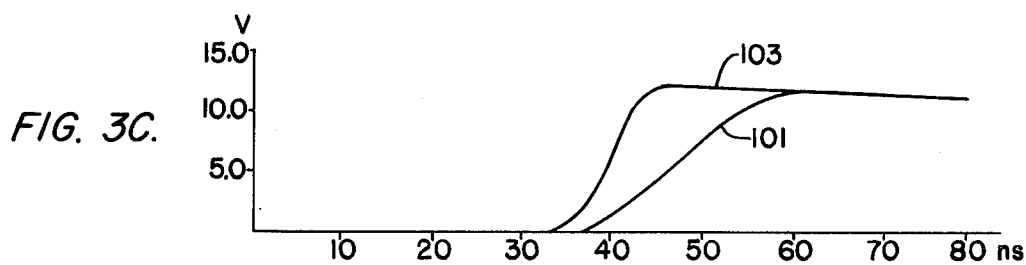
FIG. 3C shows a drive signal to be applied to the flip-flop drive circuit of the sense amplifier circuit shown in FIG. 2A.

At this time, when a drive signal $\phi_o$ is applied as shown by the curve 103 in FIG. 3C to the gate of MIS transistor 103 and the common gate of MIS transistors 11 and 12 of the flip-flop driving circuit 10 and flip-flop circuit, respectively, the MIS transistor 103 becomes conductive, decreasing the voltage of the common line 50. As a result, a voltage difference between the gate and source of the MIS transistors 13, 14 increases, and the MIS transistors 13, 14 are made conductive.

Accordingly, a current flows through the flip-flop circuit taking two different routes; one of which is the route from a power supply $V_{DD}$ to the MIS transistors 11 and 13, while the other of which is the route from the power supply $V_{DD}$ to the MIS transistors 12 and 14. Thus, these currents combine at the common source of the MIS transistors 13 and 14 and flow through the MIS transistor 103 via the common line 50 and then enter into a ground potnetial $V_{SS}$.

As mentioned above, since the potential of bit line 31 is lower than that of the bit line 31' by $\Delta V$, the gate voltage of MIS transistor 13 is also lower than that of the MIS transistor 14.

Therefore, since the transfer conductance gm of the MIS transistor 13 is smaller than that of the MIS transistor 14, the drain voltage of MIS transistor 14 becomes further lower than the drain voltage of the MIS transistor 13. Thereby, the transfer conductance of the MIS transistor 13 further becomes smaller than that of the MIS transistor 14. As described above, the initial potential difference between the bit lines 31 and 31' becomes large gradually.

The MIS transistor 103 in the flip-flop driving circuit 10 has a current amplification factor $\beta$ which is smaller than that of the MIS transistor 101. Therefore, a current flowing through the flip-flop circuit 1 is small, and the MIS transistor 101 becomes conductive with some delay of the time constant determined by a resistor 102 and a gate capacitance of the MIS transistor 101.

FIG. 3C shows that the gate potential of the MIS transistor 101 increases as indicated by the line 101 with the abovementioned delay after the drive signal $\phi_o$ is applied as shown by the curve 103. When the MIS transistor 101 becomes conductive, a current flowing through the flip-flop circuit 1 is larger than that which flows while the aforementioned MIS transistor 103 becomes conductive, since the current amplification factor $\beta$ of the MIS transistor 101 is large.

The reason why a current flowing through the flip-flop circuit is kept at first in a low level and then increased to a high level after the specified period will be explained below.

Namely, there is a deviation of the line resistance between two routes of the current flowing through the flip-flop, that is, the route connecting the MIS transistors 11 and 13 and the route connecting the MIS transistors 12 and 14, and in such case that a line resistance of the drain side of the MIS transistor 14 is larger than that of the drain side of the MIS transistor 13, an initial large current may cause a voltage drop larger than the detected signal $\Delta V$ which is present on the bit line 31, thus the potential of the bit line 31 becomes higher than that of the bit line 31', and thereby data stored in the memory cell 80 may be read out erroneously.

Figure 3D:
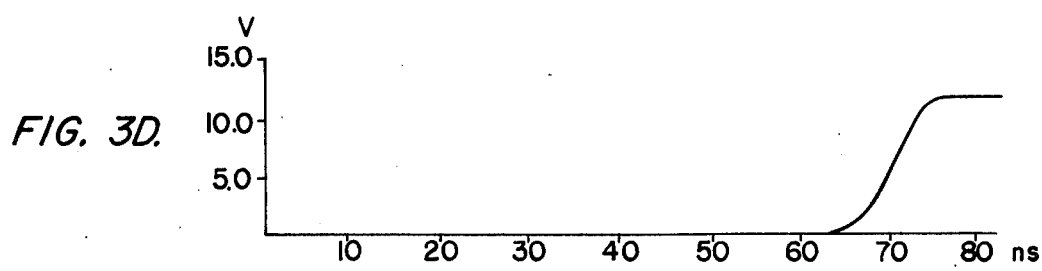
FIG. 3D shows a column selection signal to be applied to the sense amplifier circuit shown in FIG. 2A.
Figure 3E:
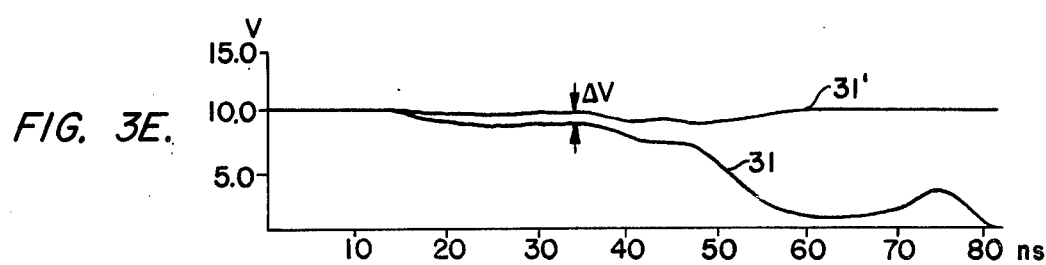
FIG. 3E shows variation of voltage on a bit line of the memory device shown in FIG. 1.
Figure 3F:
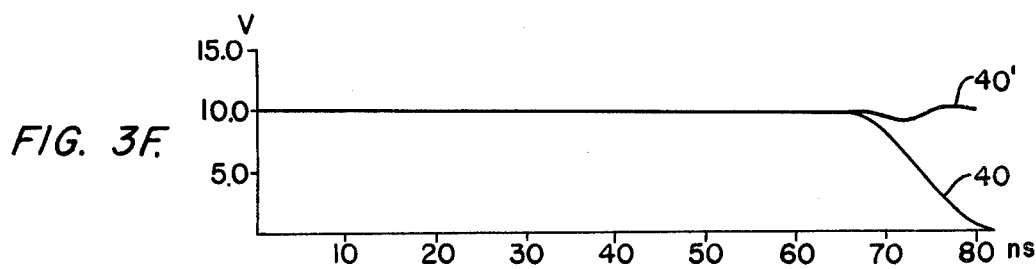
FIG. 3F shows variation of voltage on a data bus line of the memory device shown in FIG. 1.

In such a period where a voltage difference between the bit lines 31 and 31' is small and when a large current is applied, the relation of voltage difference may be inverted due to the deviation of line resistance, the MIS transistor 103 having small current amplification factor $\beta$ is forced to operate, while a current is applied to the flip-flop circuit 1 in such a low level as to not invert the voltage relation on the bit lines 31 and 31' even if there is a deviation as mentioned above in the line resistance in order to enlarge a voltage difference $\Delta V$ between the bit lines 31 and 31'. Then, after a voltage difference is enlarged to such a degree as to eliminate the capability of inverting the abovementioned voltage relation even when a high level current is applied, the MIS transistor 101 is forced to operate and, when a high level current is applied to the flip-flop circuit 1, the relation of the voltages on the bit lines 31 and 31' in accordance with the data stored in the memory cell is amplified correctly as shown in FIG. 3E. The voltage relation of the bit lines 31 and 31' correctly amplified as mentioned above is generated from the column selection signal generating circuit (not illustrated) and then applied to the common gates of the MIS transistors 87 and 88 as shown in FIG. 3D. The column selection signal CL makes the MIS transistors 87 and 88 conductive and then the voltage relation of the bit lines 31 and 31' is transmitted to the data bus lines 40, 40'. Thus, the as shown in FIG 3F, the data bus line 40 becomes low level as indicated by the curve 40, while the data bus line 40' becomes high level as indicated by the curve 40'. Thus, the data "1" is read out.

In the above explanation, data "1" is stored in the memory cell 80. Then, explanation will also be given to such read out operation when data "0" is stored.

When data "0" is stored in the memory cell 80, namely, when the capacitor 82 within the memory cell 80 is in the discharged condition, charges are stored previously in the stray capacitor of the bit lines 31 and 31'. In addition, when the word line 21 and dummy word line 72 become high level, the MIS transistors 81 and 84 become conductive, and thereby charges of the stray capacitor of the bit line 31' are stored in the capacitor 82 in the memory cell 80, while charges of the stray capacitor of bit line 31 are also stored in the capacitor 86 in the dummy cell 80'. Therefore, the potential of both bit lines 31 and 31' decreases simultaneously but, since capacitance of the capacitor 82 in the memory cell 80 is larger than that of the capacitor 86 in the dummy cell 80', the decrement of voltage of the bit line 31' is later than that of the bit line 31, namely, the potential of the bit line 31' is lowered by $\Delta V'$ as compared with the potential of the bit line 31. This relation is opposite to the relation of potential between the bit lines 31 and 31' in the case where data "1" is stored as mentioned above.

The potential relation between the bit lines 31 and 31' generated as explained above causes the data bus line 40' to become low level, while the data bus line 40 is caused to become high level on the basis of the similar principle to that described above. Thus, data "0" is read out.

Moreover, the operation of writing data to such memory device will be explained.

When writing the data "1" to the memory cell 80, the potential level of the data bus line 40' is forced to be higher than that of the data bus line 40.

With the word line 21 and the dummy word line 72 being set at the high level, when the MIS transistor 81 becomes conductive and the MIS transistors 87, 88 become conductive with the column selection signal CL being applied, the potential of the data bus line 40' and 40 is transmitted to the bit lines 31 and 31' via the MIS transistors 87 and 88.

Therefore, the capacitor 82 in the memory cell 80 is charged and, on the other hand, the capacitor 86 in the dummy cell 80' is in the discharged condition, whereby data "1" can be read out.

Meanwhile, when data "0" is to be stored, the data bus line 40' becomes, in conversion, low level, while the data bus line 40 becomes high level. Thus, the capacitor 82 in the memory cell 80 is in the discharged condition by means of the principle similar to that mentioned above, and thereby data "0" can be stored.

In above explanation, the flip-flop driving circuit 10 is indicated as the one providing a pair of MIS transistors 101, 103 and a resistor 102. Of course, the number of MIS transistors and resistors can be changed as required, as will be mentioned later.

Figure 2B:
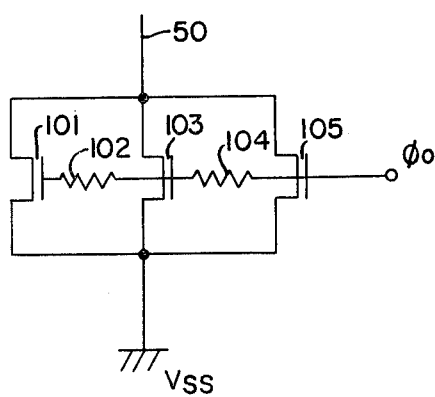
FIG. 2B and 2C respectively show further embodiments of a flip-flop circuit in the sense amplifier circuit in accordance with the present invention.

Namely, FIG. 2B shows a flip-flop driving circuit consisting of three MIS transistors 101, 103, 105 and resistors 102, 104 between respective gates.

Figure 2C:
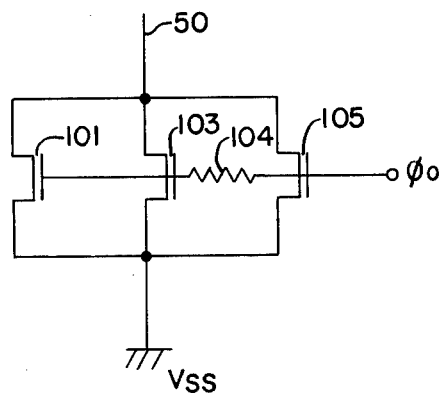

When the current amplification factors of these MIS transistors 101, 103, 105 are respectively indicated as $\beta 101$, $\beta 103$, $\beta 105$ and they are in such relation as $\beta 101 > \beta 103 > \beta 105$, a current flowing through the flip-flop circuit can be increased gradually with a time constant which is larger than that in the embodiment shown in FIG. 2A. Moreover, as shown in FIG. 2C, although a resistor 104 is connected between the gates of the MIS transistors 103 and 105 as required, the gates of the MIS transistors 101 and 103 may be connected directly without connecting a resistor.

Figure 4:
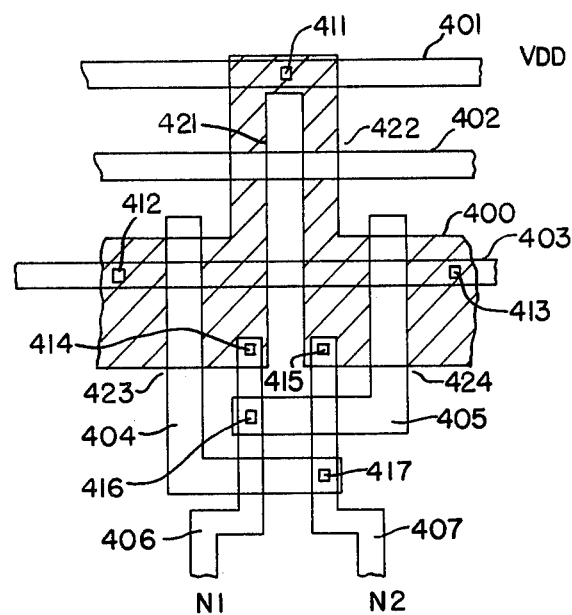
FIG. 4 shows a wiring pattern of the flip-flop circuit in the sense amplifier circuit shown in FIG. 2A.

FIG. 4 shows a pattern wiring diagram of the flip-flop circuit in the sense amplifier circuit.

This wiring pattern can be obtained by the following process. Namely, the diffusion layer 400 of phosphor (P) is formed at first on a single silicon substrate as indicated by the oblique line, and then first layer wiring patterns 402, 404 and 405 of molybdenum (Mo) are formed on the above layer, and then over that the second layer wiring patterns 401, 403, 406 and 407 of aluminum (Al) are also formed. These formations can be realized by the ordinary multi-layer wiring technology.

Then, these diffusion layer 400, molybdenum patterns 402, 404, 405 and aluminium patterns 401, 403, 406 and 407 are respectively connected through the contact holes 412, 413, 414, 415, 416 and 417. In the areas 421, 422, 423, 424 where the diffusion layer 400 crosses the molybdenum patterns 402, 404 and 405, the MIS transistor is formed and the molybdenum portion becomes the gate, while the diffusion layer at both sides of it becomes the drain and source respectively. The MIS transistors 421, 422, 423 and 424 formed here correspond respectively to the MIS transistors 11, 12, 13 and 14 of the flip-flop circuit 1 shown in FIG. 2.

The aluminium pattern 401 corresponds to the line to be connected to the power supply $V_{DD}$ of FIG. 1, while the aluminium pattern 403 corresponds to the common line 50 of FIG. 1, and the aluminium patterns 406, 407 correspond to the bit lines 31, 31', respectively.

The molybdenum pattern 402 corresponds to the common gate of the MIS transistors 11 and 12 shown in FIG. 1, and to this pattern, the drive signal $\phi_o$ is applied.

Figure 5:
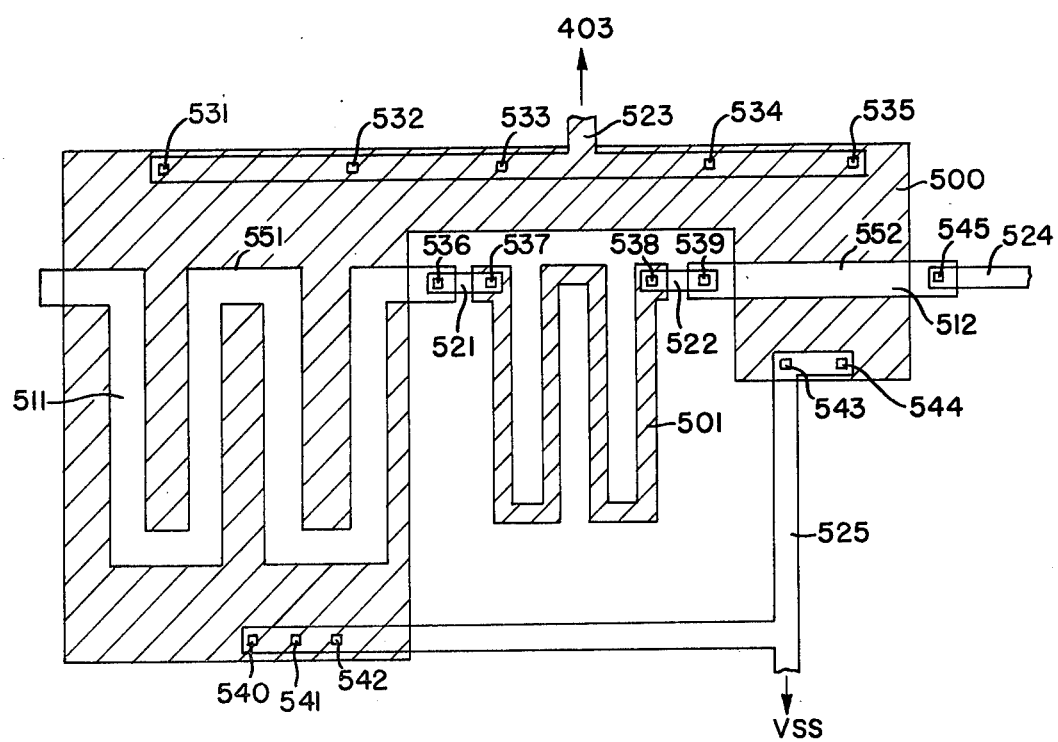
FIG. 5 shows a wiring pattern of the flip-flop circuit in the sense amplifier circuit shown in FIG. 2A.

FIG. 5 shows a pattern wiring diagram of a flip-flop driving circuit in the sense amplifier circuit.

As in the case of FIG. 4, this pattern is also formed by the following process. The diffusion layers of phosphor 500 and 501 are formed as shown by the oblique line on a single silicon substrate, and over that the first layer of the molybdenum patterns 511, 512 are formed, and then the second layer of aluminium patterns 521, 522, 523, 524 and 525 are formed. These wiring patterns can be formed by the ordinary multi-layer wiring techniques. These aluminum patterns 521, 522, 523, 524, 525 are respectively connected by means of the contact holes 531, 532, 533, 534, 535, 536, 537, 538, 539, 540, 541, 542, 543, 544 and 545.

At the areas 551 and 552, where the diffusion layer 500 and the molybdenum patterns 511, 512 are crossing, the MIS transistor is formed, and the molybdenum portion becomes the gate, while the diffusion layers at its both side become respectively the drain and source regions. In addition, the diffusion layer 501 forms a resistor. The MIG transistor 551 formed here corresponds to the MIS transistor 101 shown in FIG. 2, while the diffusion layer 501 corresponds to a resistor 102 and the MIS transistor 552 corresponds to the MIS transistor 103, respectively. As an example, the current amplification factors of the MIS transistors 101 and 103 are respectively considered as 120 $\mu v/V$ and 20 $\mu v/V$, and the resistor 102 has the resistance value of 6.25 k$\Omega$. In addition, the aluminium pattern 523 corresponds to the common line 50 in FIG. 2, and is connected to the aluminium pattern 403 in FIG. 4. The aluminium patterns 521 and 522 connect the molybdenum patterns 511, 512 and the diffusion layer 501. The aluminium pattern 525 is connected to the grounded power supply $V_{SS}$ in FIG. 2. To the aluminum pattern 524, the drive signal $\phi_o$ of the flip-flop circuit is applied.

Figure 6:
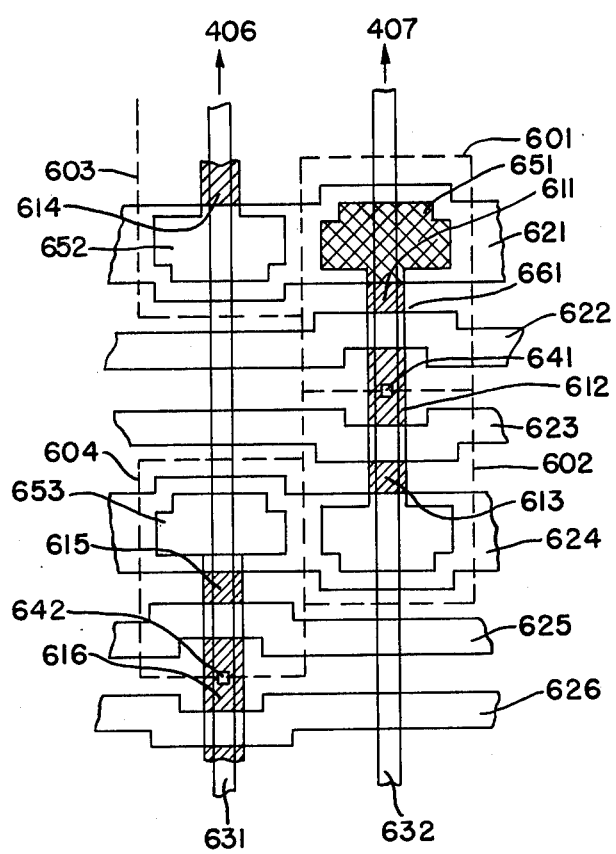
FIG. 6 shows a wiring pattern of the memory cell in the memory device shown in FIG. 1.

FIG. 6 shows a pattern wiring diagram of a memory cell used in the memory device. In the case of this pattern, as shown in the FIGS. 4, 5, the diffusion layers of phosphor 611, 612, 613, 614, 615, and 616, the thin film patterns of silicon dioxide 651, 652 and 653, and molybdenum patterns 621, 622, 623, 624, 625 and 626 are formed on a single silicon substrate as shown by the oblique line, and over that the aluminium patterns 631 and 632 are formed. Each of these patterns is connected respectively through the contact holes 641 and 642. The portions 601, 602, 603 and 604 enclosed by the broken line respectively form one memory cell. When centering on the memory cell 601, the MIS transistor 661 is formed by the diffusion laters 611, 612 and molybdenum pattern 622. The capacitor is formed at the area indicated by the crossing line where the thin film pattern 651 of silicon oxide $SiO_2$ and molybdenum pattern 621 are overlapped. Thus, the molybdenum portion becomes the gate, while both sides of it become respectively the drain and the source of the MIS transistor 661. Therefore, when the memory cell 601 corresponds to the memory cell 80 in FIG. 2, the abovementioned capacitor corresponds to the capacitor 82 in FIG. 1, while the MIS transistor 661 corresponds to the MIS transistor 81 in FIG. 1.

The aluminum patterns 631, 632 correspond to the bit lines 31', 31 shown in FIG. 2, and are respectively connected to the aluminium patterns 406, 407 in FIG. 4.

According to the sense amplifier circuit of the abovementioned this invention, a low level current flows at first into the sense amplifier circuit. Thereby, the potential difference between two bit lines is amplified without receiving an influence of the line resistance deviation up to such a level that the potential difference between said bit lines is not inverted due to the deviation of termination resistance even when a high level current flows. Thereafter, a high level current is applied for the first time. Thus, data stored in the memory cell is correctly read out.

We claim:

1. A sense amplifier circuit for amplifying a voltage difference between separated two conductors comprising,
   (a) a flip-flop circuit having a pair of cross-coupled amplifying elements, said two conductors being connected to said flip-flop circuit, and
   (b) a driving circuit connected to said flip-flop circuit for controlling a current flowing through said flip-flop circuit, said driving circuit having at least two MIS transistors having gates which are connected via a resistive means, wherein a signal for driving said driving circuit is directly applied to the gate of one of said MIS transistors and wherein said signal is applied to the other of said MIS transistors through said resistive means with time delay.

2. The sense amplifier circuit as recited in claim 1 wherein said driving circuit comprises a pair of MIS transistors, and wherein a current amplification factor of one of said pair of MIS transistors of said driving circuit is smaller than that of the other of said pair of MIS transistors.

3. The sense amplifier circuit as recited in claim 2 wherein the gates of said pair of MIS transistors in said driving circuit consist of molybdenum.

4. The sense amplifier circuit as recited in claim 2 wherein said resistive means connected between the gates of said pair of MIS transistors in said driving circuit is a diffused resistor.

5. The sense amplifier circuit as recited in claim 2 which comprises a further MIS transistor having a gate connected to said other one of said pair of MIS transistors via a second resistor.

6. The sense amplifier circuit as recited in claim 1 which comprises a further MIS transistor being connected in parallel to said other of said pair of MIS transistors.

7. A semiconductor memory device with a plurality of memory cells formed in a semiconductor substrate, comprising,
(a) one common line,
(b) a plurality of flip-flop circuits connected to said one common line,
(c) a pair of bit lines connected to each of said flip-flop circuits,
(d) a plurality of semiconductor memory cells connected to said bit lines, and
(e) a driving circuit for controlling a current flowing through one of said flip-flop circuits connected to said one common line, said driving circuit having at least two MIS transistors having gates connected via a resistor, and a signal for driving said driving circuit being directly applied to said gate of one of said MIS transistors, and said signal being applied to the other of said MIS transistors through said resistor with time delay.

* * * * *

UNITED STATES PATENT AND TRADEMARK OFFICE
CERTIFICATE OF CORRECTION

PATENT NO. : 4,158,241
DATED : June 12, 1979
INVENTOR(S) : Takemae et al

It is certified that error appears in the above-identified patent and that said Letters Patent are hereby corrected as shown below:

```
Column 2, line  2, "though" should be -- through --;
Column 4, line 53, "potnetial" should be -- potential --;
Column 5, line 57, delete "the", second occurrence;
Column 7, line  7, "aluminium" should be -- aluminum --;
Column 7, line 18, "aluminium" should be -- aluminum --;
Column 7, line 20, "aluminium" should be -- aluminum --;
Column 7, line 21, "aluminium" should be -- aluminum --;
Column 7, line 33, "aluminium" should be -- aluminum --;
Column 7, line 46, "MIG" should be -- MIS --;
Column 7, line 54, "aluminium" should be -- aluminum --;
Column 7, line 56, "aluminium" should be -- aluminum --;
Column 7, line 58, "aluminium" should be -- aluminum --;
Column 8, line  1, "aluminium" should be -- aluminum --;
Column 8, line  7, "laters" should be -- layers --;
Column 8, line 19, "aluminium" should be -- aluminum --.
```

Signed and Sealed this

Ninth Day of October 1979

[SEAL]

Attest:

RUTH C. MASON
Attesting Officer

LUTRELLE F. PARKER
Acting Commissioner of Patents and Trademarks